US012545993B2

(12) United States Patent
Miao et al.

(10) Patent No.: US 12,545,993 B2
(45) Date of Patent: Feb. 10, 2026

(54) TANTALUM SPUTTERING TARGET WITH IMPROVED PERFORMANCE AND PREDICTABILITY AND METHOD OF MANUFACTURING

(71) Applicant: Tosoh SMD, Inc., Grove City, OH (US)

(72) Inventors: Weifang Miao, Columbus, OH (US); Eduardo del Rio Perez, Dublin, OH (US); Alex Kuhn, Columbus, OH (US); Michael McCarthy, Grove City, OH (US); John Rizer, Grove City, OH (US); Erich Theado, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 19/201,838

(22) Filed: May 7, 2025

(65) Prior Publication Data

US 2025/0270687 A1 Aug. 28, 2025

Related U.S. Application Data

(63) Continuation of application No. 19/039,835, filed on Jan. 29, 2025, which is a continuation of application No. PCT/US2024/058759, filed on Dec. 5, 2024.

(Continued)

(51) Int. Cl.

| | |
|---|---|
| ***C23C 14/34*** | (2006.01) |
| ***C22C 27/02*** | (2006.01) |
| ***C22F 1/18*** | (2006.01) |

(52) U.S. Cl.

CPC .......... *C23C 14/3414* (2013.01); *C22C 27/02* (2013.01); *C22F 1/18* (2013.01)

(58) Field of Classification Search

None

See application file for complete search history.

(56) References Cited

U.S. PATENT DOCUMENTS

| | | | | |
|---|---|---|---|---|
| 8,500,928 | B2 | 8/2013 | Matera et al. | |
| 11,062,889 | B2 * | 7/2021 | Ivanov ...................... | B22F 3/18 |

(Continued)

FOREIGN PATENT DOCUMENTS

| | | | |
|---|---|---|---|
| CN | 114990502 | A | 9/2022 |

OTHER PUBLICATIONS

Patent Cooperation Treaty (PCT), International Search Report and Written Opinion for Application PCT/US2024/058759 filed Dec. 5, 2024, mailed Mar. 28, 2025, International Searching Authority, KR.

(Continued)

*Primary Examiner* — Jason Berman

(74) *Attorney, Agent, or Firm* — McDonald Hopkins LLC

(57) ABSTRACT

A method for making tantalum sputtering targets with stable through thickness {100}+{111} preferred crystallographic orientation volume fraction is disclosed. Starting from electron beam melted tantalum ingots, the method includes various forging, controlled rolling and recrystallization annealing. The resultant tantalum sputtering targets yield stable deposition rate and film uniformity from burn-in through the end-of-life during sputtering. Also disclosed is a tantalum sputtering target made in accordance with the disclosed method.

11 Claims, 11 Drawing Sheets

Related U.S. Application Data

(60) Provisional application No. 63/606,258, filed on Dec. 5, 2023.

(56) References Cited

U.S. PATENT DOCUMENTS

| | | | | |
|---|---|---|---|---|
| 2002/0112789 | A1 | 8/2002 | Jepson et al. | |
| 2003/0089430 | A1 * | 5/2003 | Perry | C23C 14/3414 148/695 |
| 2007/0089815 | A1 | 4/2007 | Wickersham et al. | |
| 2009/0038362 | A1 * | 2/2009 | Jepson | H01J 37/3426 428/546 |
| 2018/0080120 | A1 | 3/2018 | Ivanov et al. | |
| 2020/0131622 | A1 * | 4/2020 | Nagatsu | C22C 27/02 |

OTHER PUBLICATIONS

Z. Zhang et al., "Effect of grain orientation on tantalum magnetron sputtering yield." J. Vac. Sci. Techol. A24(4), Jul./Aug. 2006., pp. 1107-1111. 5 pages.

* cited by examiner

| Tantalum Target | Process | Upset Forge Reduction | Rolling Reduction per Pass | Through thickness Average | | | Through Thickness Standard Deviation | | | Through thickness Non-Uniformity | | |
|---|---|---|---|---|---|---|---|---|---|---|---|---|
| | | | | Center | Mid Radius | Outer Radius | Center | Mid Radius | Outer Radius | Center | Mid Radius | Outer Radius |
| Example 1 | New | 31% | 6-11% (varying) | 0.63 | 0.61 | 0.66 | 0.09 | 0.09 | 0.10 | 14.9% | 14.6% | 15.2% |
| Comparative Example 1 | Prior | 58% | 12% | 0.52 | 0.51 | 0.55 | 0.15 | 0.17 | 0.12 | 28.0% | 32.3% | 22.5% |

FIG. 10

| Tantalum Target | Process | Upset Forge Reduction | Rolling Reduction per Pass | Final Anneal Temperature (°C) | Average NU% | Range (%) | Standard Deviation (%) |
|---|---|---|---|---|---|---|---|
| Example 2 | New | 24% | 6-11% (varying) | 1,000 | 1.35 | 0.46 | 0.11 |
| Example 3 | New | 25% | 6-11% (varying) | 1,000 | 1.55 | 0.61 | 0.14 |
| Comparative Example 2 | Prior | 58% | 12% | 1,000 | 2.05 | 2.91 | 0.99 |
| Comparative Example 3 | Prior | 58% | 12% | 1,100 | 2.41 | 3.75 | 1.25 |

FIG. 11

| Tantalum Target | Process | Upset Forge Reduction | Rolling Reduction per Pass | Final Anneal Temperature (°C) | Mean Dep Rate (Å/s) | Dep Rate Range (Å/s) | Standard Deviation (Å/s) |
|---|---|---|---|---|---|---|---|
| Example 2 | New | 24% | 6-11% (varying) | 1,000 | 6.21 | 0.47 | 0.13 |
| Example 3 | New | 25% | 6-11% (varying) | 1,000 | 6.10 | 0.07 | 0.02 |
| Comparative Example 2 | Prior | 58% | 12% | 1,000 | 6.48 | 1.45 | 0.55 |
| Comparative Example 3 | Prior | 58% | 12% | 1,100 | 7.16 | 2.81 | 0.89 |

FIG. 12

TANTALUM SPUTTERING TARGET WITH IMPROVED PERFORMANCE AND PREDICTABILITY AND METHOD OF MANUFACTURING

CROSS-REFERENCE TO RELATED APPLICATIONS

This application is a continuation of U.S. patent application Ser. No. 19/039,835, filed Jan. 29, 2025, which is a continuation of International Patent Application No. PCT/US2024/058759 filed Dec. 5, 2024, which claims priority to and the benefit of U.S. Provisional Patent App. No. 63/606,258, filed Dec. 5, 2023, and titled, "Tantalum Sputtering Target with Improved Performance Predictability and Method of Manufacturing", each of which is herein incorporated by reference in its entirety.

FIELD OF INVENTION

This application relates to sputtering targets and methods of manufacturing, namely tantalum sputtering targets and methods of manufacturing.

BACKGROUND

The typical manufacturing and fabrication method of tantalum (Ta) metal plates consists of convoluted, multi-step processes that impart violent deformation strains to shape and conform Ta to the desired round disc-shaped form with specific microstructural and crystallographic characteristics. The plates produced from such processes exhibit performance issues in the field with noticeable plate-to-plate variation affecting the stability of the physical vapor deposited (PVD) formed thin films with respect to deposition rate and film uniformity, negatively affecting the production process yield.

Accordingly, there is a need to produce Ta sputtering targets with stable performance in terms of deposition rate and film uniformity.

SUMMARY OF INVENTION

The following presents a summary of this disclosure to provide a basic understanding of some aspects. This summary is intended to neither identify key or critical elements nor define any limitations of embodiments or claims. This summary may provide a simplified overview of some aspects that may be described in greater detail in other portions of this disclosure. Furthermore, any of the described aspects may be isolated or combined with other described aspects without limitation to the same effect as if they had been described separately and in every possible combination explicitly.

The present invention relates to tantalum sputtering targets and to methods of making, wherein the targets exhibit uniform texture through thickness and across the diameter of the plate, in particular in terms of the preferred crystallographic orientation volume fraction of {100}+{111}. The invention produces tantalum sputtering targets with stable deposition rate from burn-in through the end-of-life and repeatable target-to-target performance.

In one exemplary embodiment, a method to produce a tantalum target with controlled texture and stabilized shear force application through the thickness of the plate starts with a) electron beam melting tantalum material to form a tantalum ingot with large grain size (typically tens of mm), b) thermo-mechanically processing the tantalum ingot to break the coarse structure to produce a tantalum billet with relatively fine microstructure (grain size typically 100-300 μm), c) slicing the billet with a predetermined height to diameter aspect ratio, d) upset forge the tantalum piece, and e) friction rolling the pressed billet to a defined strain and friction control process that distributes the strain uniformly from the surface to the bulk of the plate.

In some embodiments, the average crystallographic texture desired for achieving this predictable behavior, defined by the combination of the two main orientations in bcc metals crystal plane families {100}+{111}, typically measured via electron backscatter diffraction (EBSD) technique, is typically averaged between 60 and 70% of the total volume fraction of crystallographic planes. In addition, the through thickness variation of {100}+{111} volume fraction is generally less than 15% of the total volume fraction of crystallographic planes. Secondary compulsory crystal families like {110} and others account for 30-40%.

The invented process provides thermomechanical deformation and microstructure generation needed to provide a predictable performance during sputtering by means of achieving film uniformity better than 2%.

The invented process also achieves a stable microstructure and crystallographic texture capable of producing a stable deposition rate from the beginning of the sputtering process to the completion of the sputtering target usable life.

In some embodiments, the improved predictability of the deposition rate and film uniformity provided added benefits for yield improvement during the sputtering process by maintaining stable deposition performance through the life of the target, greatly reducing the need for in-process parameter adjustments.

In one aspect of the invention, a method of making a tantalum sputtering target comprising the steps of: providing a tantalum ingot, the ingot having a generally cylindrical configuration with a central longitudinal axis; sectioning the tantalum ingot by cutting the tantalum ingot transverse to the central longitudinal axis to form at least a billet slice; wherein the billet slice is generally cylindrical and shorter than the tantalum ingot, when measured along the central longitudinal axis of the tantalum ingot and a central longitudinal axis of the billet slice; thermo-mechanically processing the billet slice to form a tantalum target blank, wherein the thermo-mechanically processing is comprised of upset forging reduction and varying rolling reduction; the upset forging reduction results in a thickness reduction between about 15%-35% of the billet slice and the varying rolling reduction results in a thickness reduction of the billet slice varying between about 5%-15% per pass.

In some exemplary embodiments of the invention, the tantalum target has a total volume fraction of crystallographic texture planes, wherein the tantalum target has an average of {100}+{111} volume fraction of the crystallographic texture planes equal to about 55-75% of the total volume fraction of crystallographic texture planes.

In other exemplary embodiments of the invention, the tantalum target has a through thickness crystallographic texture variation of a {100}+{111} volume fraction of less than about 20% of a total volume fraction of crystallographic planes within the tantalum target.

In additional exemplary embodiments of the invention, the tantalum target, when sputtered, produces a deposited film having a non-uniformity better than 2% through a life of the tantalum target, wherein the life of the tantalum target is from a burn-in of the tantalum target to end-of-life of the tantalum target.

In some exemplary embodiments of the invention, a deposition rate throughout a life of the tantalum target, when sputtered, has less than 5% deviation from an average deposition rate throughout the life of the tantalum target.

In other exemplary embodiments of the invention, the tantalum ingot has a purity of 99.99% or greater.

In additional exemplary embodiments of the invention, the varying rolling reduction is clock rolling.

In some exemplary embodiments of the invention, the method further comprises the steps of: annealing and leveling the tantalum target blank; and machining the target blank and bonding the target blank to a backing plate after the machining.

In other exemplary embodiments of the invention, the thermo-mechanically processing of the billet slice to form the tantalum target blank includes only a single rolling process, wherein the single rolling process is the varying rolling reduction.

In additional exemplary embodiments of the invention, the thermo-mechanically processing of the billet slice to form the tantalum target blank includes only a single rolling process, wherein the single rolling process is the varying rolling reduction.

In yet another aspect of the invention, a tantalum sputtering target made in accordance with the method described above.

In a further aspect of the invention, a method of making a tantalum sputtering target comprising the steps of: providing a tantalum ingot, the ingot having a generally cylindrical configuration with a central longitudinal axis; sectioning the tantalum ingot by cutting the tantalum ingot transverse to the central longitudinal axis to form at least a billet slice; wherein the billet slice is generally cylindrical and shorter than the tantalum ingot, when measured along the central longitudinal axis of the tantalum ingot and a central longitudinal axis of the billet slice; thermo-mechanically processing the billet slice to form a tantalum target blank, wherein the thermo-mechanically processing is comprised of upset forging reduction and a single rolling process; the upset forging reduction results in a thickness reduction between about 15%-35% of the billet slice and the single rolling process results in a thickness reduction of the billet slice varying between about 5%-15% per pass.

In yet another aspect of the invention, a tantalum sputtering target is disclosed comprising: a tantalum sputtering target having a total volume fraction of crystallographic texture planes, wherein the tantalum sputtering target has an average of {100}+{111} volume fraction of the crystallographic texture planes equal to about 55-75% of the total volume fraction of crystallographic texture planes; and/or the tantalum sputtering target having a through thickness crystallographic texture variation of a {100}+{111} volume fraction of less than about 20% of the total volume fraction of crystallographic planes within the tantalum sputtering target.

In some exemplary embodiments, the tantalum sputtering target, when sputtered, produces a deposited film having a non-uniformity better than 2% through a life of the tantalum target, wherein the life of the tantalum sputtering target is from a burn-in of the tantalum sputtering target to an end-of-life of the tantalum sputtering target.

In other exemplary embodiments, a deposition rate throughout a life of the tantalum sputtering target, when sputtered, has less than 5% deviation from an average deposition rate throughout the life of the tantalum sputtering target.

In further exemplary embodiments, the tantalum sputtering target has a purity of 99.99% or greater.

In additional exemplary embodiments, the tantalum sputtering target is produced by thermo-processing a billet slice to for a tantalum target blank using upset forging reduction and a single rolling process.

In other exemplary embodiments, the single rolling process is varying clocked rolling reduction.

In further exemplary embodiments, the varying clocked rolling reduction results in a thickness reduction of the billet slice between about 5%-15% per pass.

In additional exemplary embodiments, the upset forging results in a thickness reduction of the billet slice between about 15%-35%.

The following description and the drawings disclose various illustrative aspects. Some improvements and novel aspects may be expressly identified, while others may be apparent from the description and drawings.

BRIEF DESCRIPTION OF THE DRAWINGS

The accompanying drawings illustrate various systems, apparatuses, devices and methods in which like reference characters refer to like parts throughout, and in which:

FIG. 10 is a table comparing {100}+{111} volume fraction for tantalum sputtering targets manufactured using the typical exemplary method shown in FIG. 1 and the new method shown in FIGS. 2-3 in accordance with various disclosed aspects herein;

FIG. 11 is a table comparing film Rs non-uniformity (NU %) for tantalum sputtering targets manufactured using the typical exemplary method shown in FIG. 1 and the new method shown in FIGS. 2-3 in accordance with various disclosed aspects herein; and FIG. 12 is a table comparing deposition rate (Å/s) for tantalum targets manufactured using the typical exemplary method shown in FIG. 1 and the new method shown in FIGS. 2-3 in accordance with various disclosed aspects herein.

The disclosed embodiments may be embodied in several forms without departing from its spirit or essential characteristics. The scope of the invention is defined in the appended claims, rather than in the specific description preceding them. All embodiments that fall within the meaning and range of equivalency of the claims are therefore intended to be embraced by the claims.

DETAILED DESCRIPTION

Tantalum targets have been used in physical vapor deposition (PVD) or sputtering to deposit tantalum and/or tantalum-nitride films, which act as barrier layers between copper interconnect layers and silicon wafer architectures in semiconductor devices. It has been shown that texture has a significant effect on sputtering performance, in particular film uniformity and deposition rate. Good uniformity and stable deposition rate are highly desirable for semiconductor manufacturing. To achieve these desirable properties, various fabrication techniques have been used to produce tantalum sputtering targets.

Figure 1:
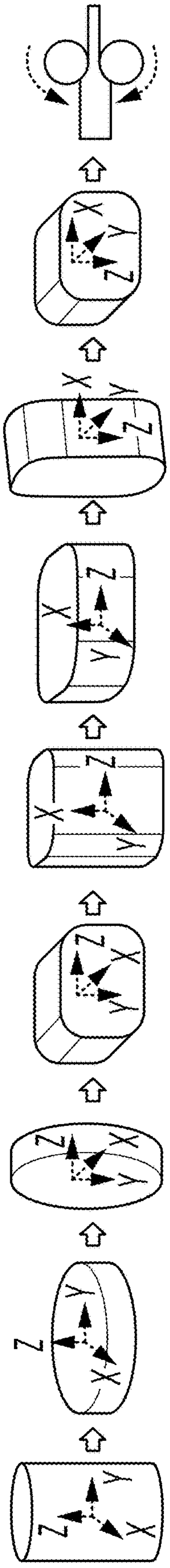
FIG. 1 illustrate a typical exemplary method of manufacturing a Ta target.

The typical manufacturing and fabrication methods of tantalum targets consist of convoluted, multi-step processes that impart violent deformation strains to shape and conform tantalum to the desired form with specific microstructural and crystallographic characteristics, with one example depicted in FIG. 1. The methods typically utilized utilize forging, swaging, pressing, rolling, asymmetric rolling, triaxial deformation, extrusion, high-shear torsion and spinning to impart a variety of mechanical forces (tensile, compressive or shear) onto the metal to improve microstructure and texture.

While the methods to generate the forging, swaging, pressing and rolling are well documented in literature for tantalum sputtering targets, the targets produced from such typical processes still exhibit performance issues in the field with noticeable through thickness and target-to-target texture variation, affecting the stability of the PVD formed thin films with respect to deposition rate and film uniformity, reducing production process yield. Furthermore, the traditional method of analysis for tantalum plates produced for sputtering targets cannot fully predict the performance of the thin film deposited. The available metallographic sampling methods are destructive which limits the process to capturing small samples from discarded edge locations of the plate to infer that such sample is representative of the bulk of the tantalum plate. Therefore, one cannot take a sample of a plate designated for use because doing so will prevent the plate from being useable for sputtering. Further, since the texture varies throughout the plates, one cannot sample a discarded edge of the plate and infer that such sample is representative of the bulk of the tantalum plate. Thus, the available metallographic sampling methods cannot be used to identify desirable tantalum plates for use as sputtering targets.

It is generally accepted that the sputter yield or deposition rate is strongly related to crystallographic orientation of the sputtering target texture. The sputter yield of more closely packed planes is usually higher than that of the less densely packed planes. For body centered cubic (bcc) tantalum, the packing densities of main texture orientations are in the order of {110}>{100}>{111}. Therefore, as demonstrated by previous work (e.g., Zhang et al., *Effect of Grain Orientation on Tantalum Magnetron Sputter Yield*, J. Vac. Sci. Technol. A 24, 1107-1111 (2006)), the sputter yield of different texture orientations is in the following order: {110}>{100}>{111}. In addition, since the sputter yields for {100} and {111} textures are close, and {100}+{111} textures usually possesses the highest volume fraction in tantalum sputtering target, it is reasonable to use the uniformity and consistency of {100}+{111} texture to predict the sputtering performance of tantalum targets.

Accordingly, there is a need to produce tantalum sputtering targets with consistent {100}+{111} texture volume fraction though thickness and across different locations (e.g., center, mid-radius and outer-radius of the tantalum target). Tantalum targets with such characteristics are expected to have stable sputtering performance in terms of deposition rate and film uniformity.

Figure 2:
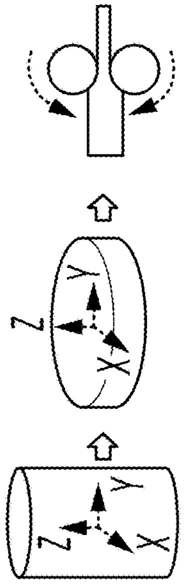
FIG. 2 illustrates a method of manufacturing a Ta target in accordance with various disclosed aspects herein.
Figure 3:
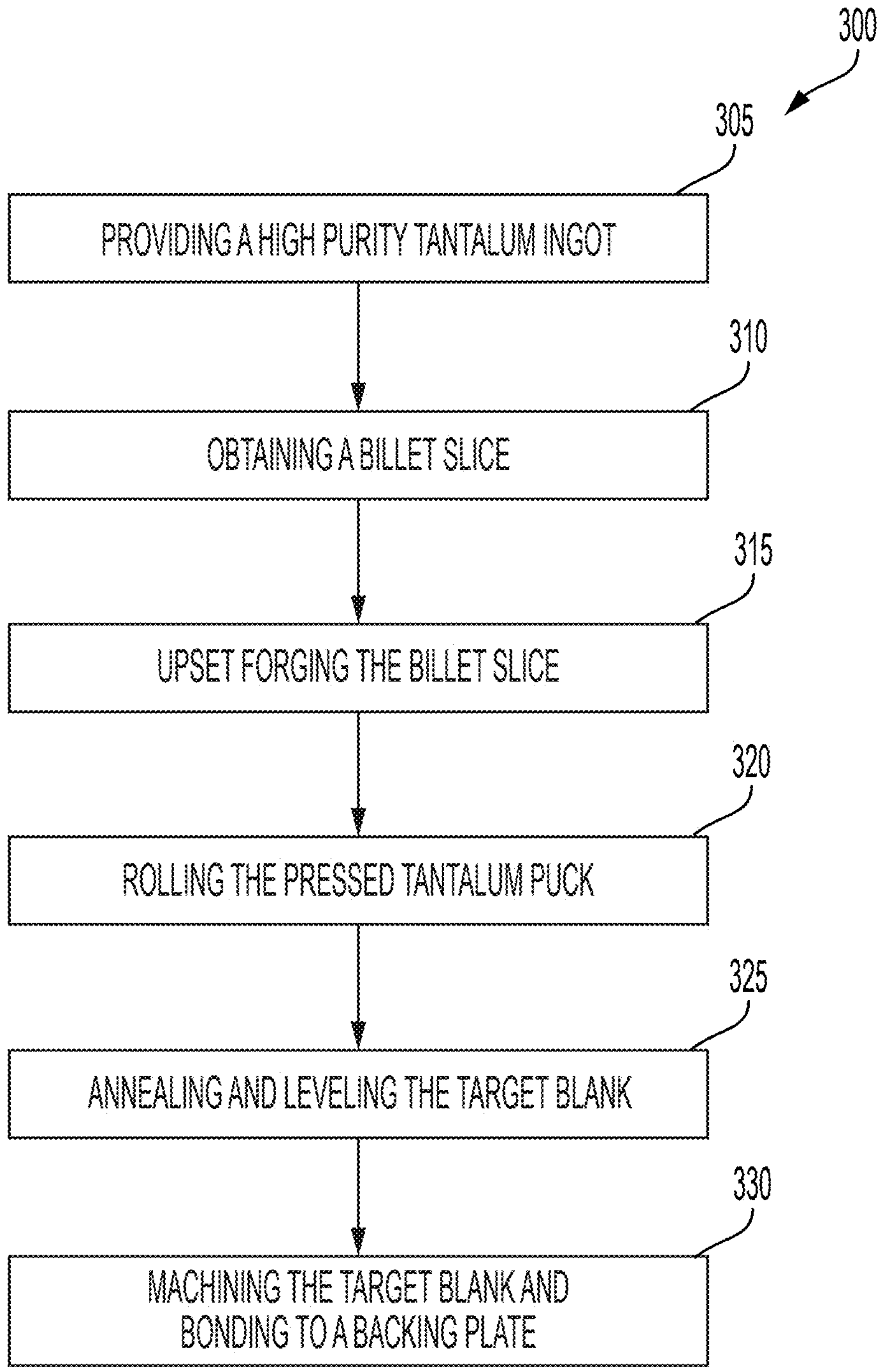
FIG. 3 is a flowchart detailing the method of manufacturing shown in FIG. 2 in accordance with various disclosed aspects herein.

A new method 300 of producing tantalum sputtering targets is depicted in FIGS. 2-3. In 305, a high purity tantalum ingot is provided. The high purity tantalum ingot may be generally cylindrical, due to variances in the manufacturing process. The high purity tantalum ingot may be comprised of at least about 99.99% tantalum. In some exemplary embodiments, the high purity tantalum ingot may be at least about 99.995% tantalum. The tantalum ingot may be cast via electron beam melting. The tantalum ingot is then subject to a series of thermo-mechanical steps to obtain forged billets with average grain size of about 300 μm or less. The thermos-mechanical steps include a forging process and an annealing process. The forging process may include swaging and upset forging, and the annealing process may be carried out at different stages at temperatures between about 1,000° C.-1,250° C. The tantalum ingot has a generally cylindrical configuration with a central axis. The central axis of the tantalum ingot is the central longitudinal axis running along the length (height) of the tantalum ingot.

In 310, a billet slice is obtained. In an exemplary embodiment, the billet slice may be obtained by sawing a section of the forged and annealed high purity tantalum ingot to a predetermined length, based on a desired size for the resulting target blank. Stated alternatively, the high purity tantalum ingot may be sawed such that the billet slice has a predetermined height to diameter aspect ratio, with the height of the billet slice being greater than the diameter. The billet slice has a central axis, represented by the "Z" axis in FIG. 2. The central axis of the billet slice is the central longitudinal axis running along the length (height) of the billet slice.

In some embodiments of 310, the billet slice is obtained by sectioning the ingot by cutting the ingot transverse to the central longitudinal axis of the ingot to form at least a billet slice. The billet slice is generally cylindrical and shorter than the tantalum ingot, when measured along said central longitudinal axis of said tantalum ingot and a central longitudinal axis of said billet slice.

In 315, the billet slice is upset forged, thereby producing a pressed tantalum puck. In an exemplary embodiment, the billet slice may be upset forged (upset forging reduction) by pressing the billet slice along its central longitudinal axis. Stated alternatively, the billet slice may be upset forged by pressing the billet slice in the same direction as (parallel to) its central longitudinal axis, represented by the "Z" axis in FIG. 2. In an exemplary embodiment, the upset forging may result in a height reduction of the billet slice between about 15%-35%. Stated alternatively, the height of the pressed tantalum puck along its central axis may be between about 15%-35% less than the height of the billet slice along its central axis, where the central axis of the pressed tantalum puck runs from the center of the top of the pressed tantalum puck to the center of the bottom of the pressed tantalum puck.

The height of the billet slice along its central axis may also be referred to as the thickness of the billet slice. Similarly, the height of the pressed tantalum puck along its central axis may also be referred to as the thickness of the pressed tantalum puck. Accordingly, the upset forging reduction of the billet slice may result in a thickness reduction between about 15%-35% of the billet slice. Stated alternatively, the upset forging may result in a height reduction of the billet slice between about 15%-35%.

After upset forging, in 320, the pressed tantalum puck is then rolled using varying rolling reduction. In an exemplary embodiment, the rolling is a single rolling process to produce a target blank. Stated alternatively, the pressed tantalum puck may be subjected to only a single rolling process. In an exemplary embodiment, the single rolling process may be cold clock rolling. In some exemplary embodiments, the pressed tantalum puck is clock rolled using rolling reduction of about 6%-11% per pass. Stated alternatively, in some exemplary embodiments, the pressed tantalum puck may be clock rolled, with a height reduction of about 6%-11% per pass. In some exemplary embodiments, the rolling may have a friction and roll speed between about 30-50 fpm without exceeding a separation force ranging between about 3M-4M lbf. As can be seen, the tantalum puck is friction rolled in a defined strain and friction control process that distributes the strain uniformly from the surface of the tantalum puck to the bulk of the tantalum puck.

Thus, as can be seen, only a single rolling process performed during the thermo-mechanical processing in 315 and 320 to process billet slice present at the beginning of 315 into the target blank at the end of 320 (prior to the target blank being annealed and leveled in 325).

As can be seen, the billet slice to form a tantalum target blank in 315 and 320. The thermo-mechanically processing may include upset forging reduction and a single rolling process. The upset forging reduction may result in a thickness reduction between about 15%-35% of said billet slice. The single rolling process may result in a thickness reduction of the billet slice varying between about 5%-15% per pass.

In 325, the resultant target blank is then annealed followed by leveling. In an exemplary embodiment, the target blank may be leveled via roll leveling and may be annealed via vacuum annealing, such as between about 950° C.-1, 050° C. to achieve a predominantly fully recrystallized state.

In 330, the target blank is then machined and bonded to a backing plate, thereby forming a sputtering target. In some exemplary embodiments, the bonding may be diffusion bonding.

The machining of the target blank in 330 may produce discarded edge locations. In some embodiments of the method 300, a sample of the discarded edge locations may be tested for texture and through thickness texture uniformity, since, as will be discussed below, the discarded edge locations of tantalum target blanks and sputtering targets produced using the method 300 described above are representative of the center and mid-radius locations on the tantalum target blank and sputtering target. In some exemplary embodiments, this testing may be performed prior to bonding the machined target blank to the backing plate. In other exemplary embodiments, the testing may be performed after bonding the machined target blank to the backing plate.

The ability to test a sample of the discarded edge location (s) and obtain results representative of the texture and through thickness texture uniformity throughout the entire the machined target blank provides a significant advantage to users. Users are able to know the texture and through thickness texture uniformity of the machined target blank (also known as the sputterable portion of the sputtering target) before using the sputtering target, which will assist the user in predicting the performance of the target blank and sputtering target.

As was stated above, the discarded edge locations of the target blanks and sputtering targets made using the traditional methods cannot be used to ascertain results due to the non-uniformity of the texture and through thickness texture in the target blanks and sputtering targets made using the traditional methods. This is a significant advantage of target blanks and sputtering targets made in accordance with method 300.

The average grain size of the tantalum target blank made in accordance with the method 300 described above is typically between about 40-about 80 μm, and the average {100}+{111} volume fraction is typically between about 55%-75% with through thickness variation of less than about 20%.

Also, wherein the tantalum target has a total volume fraction of crystallographic texture planes. Further, the tantalum target has an average of {100}+{111} volume fraction of the crystallographic texture planes equal to about 55-75% of the total volume fraction of the crystallographic texture planes.

Further, the tantalum target has a through thickness crystallographic texture variation of {100}+{111} volume fraction of less than about 20% of a total volume fraction of crystallographic planes within the tantalum target.

Further, as will be discussed below, a tantalum target having a tantalum target blank made in accordance with the method 300 described above provides predictable sputtering performance with deposited film non-uniformity better than 2% through the life of the sputtering target. Stated alternatively, the tantalum target provides predictable sputtering performance with deposited film non-uniformity better than 2% from burn-in to end-of-life of the sputtering target.

Additionally, as will be discussed below, a tantalum target having a tantalum target blank made in accordance with the method 300 described above exhibits a stable deposition rate through the life of the sputtering target with less than 5% deviation from the average deposition rate of the tantalum target. Stated alternatively, the tantalum target exhibits a stable deposition rate from burn-in to end-of-life of the sputtering target with less than 5% deviation from the average deposition rate of the tantalum target.

One should be mindful of the upset forge ratio of the tantalum billet. Since it has been shown that upset forging creates {111} texture banding around half depth of the tantalum target, leading to unstable deposition rate and inferior film uniformity, the upset forge ratio cannot be too high. On the other hand, not enough upset forging results in too much edge folding during subsequent rolling operation, reducing material usage efficiency, and potentially causing scrap.

It has been found that varying per pass reduction during rolling is beneficial for achieving more uniform through thickness texture in terms of {100}+{111} volume fraction. It has been further discovered that increasing per pass reduction gradually is more beneficial, such as about 10-20% gradual increase per pass. The reason is believed to be that more reduction at later stage of rolling generates more shear action around half depth of tantalum blank, favoring the reduction of {111} texture banding.

As can be seen, this new method 300 of producing a tantalum target differs from typically used methods, such as the method shown in FIG. 1, which requires the use of multiple different types of rolling processes, such as cross-rolling, asymmetric rolling or friction rolling, tilt-rolling, and/or roll mills with pre-determined shaped rolls to impart localized shear forces to the metal plate.

Below are Examples 1-3 detailing the properties and performance of target blanks and sputtering targets made in accordance with the above method 300 shown in FIGS. 2-3. It should be noted that these examples are for illustration purposes, and the method 300 disclosed herein is not limited to or by these examples in any way. Also discussed below are Comparative Examples detailing the properties and performance of target blanks and sputtering targets made in accordance with the typical method shown in FIG. 1. The Tantalum slices used in the Examples 1-3 and Comparative Examples 1-3 were produced using the same processes as outlined in 305 above, such that the tantalum slices were metallurgically identical to avoid impacting the testing results discussed below.

Example 1—Made in Accordance with Method 300

A tantalum slice was sawed from a tantalum billet, which was converted from an electron beam melted tantalum ingot via a series of forging and annealing steps, as outlined in 305. The tantalum billet slice was first upset forged to create a pressed tantalum puck having a 31% thickness reduction. The pressed tantalum puck was then cold clock rolled using varying reduction per pass of 6-11% to obtain an 18-inch diameter×0.37-in thick tantalum blank. The tantalum blank was then subjected to 1,000° C. final anneal and roll leveled.

Figure 4A:
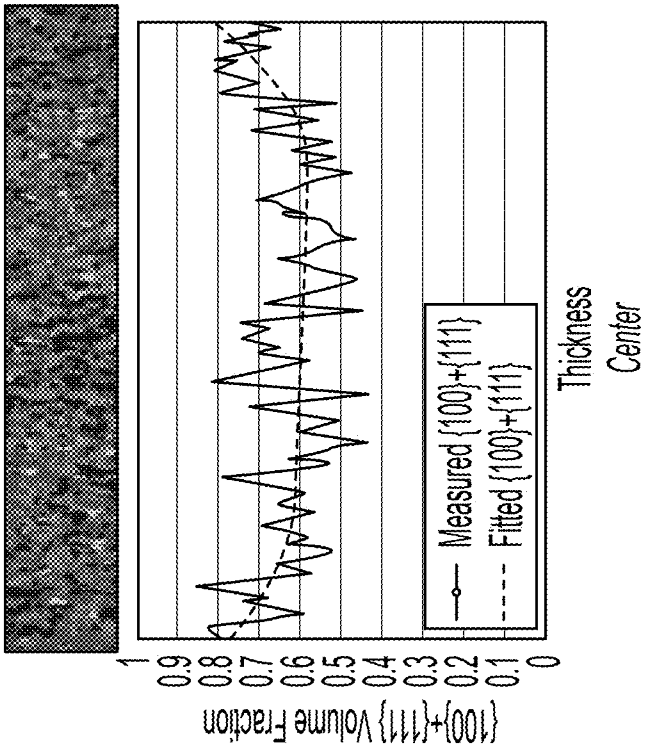
FIGS. 4A-C are through thickness EBSD orientation maps and {100}+{111} volume fraction plots at different locations of a tantalum target blank produced using the method shown in FIGS. 2-3 in accordance with various disclosed aspects herein.
Figure 4B:
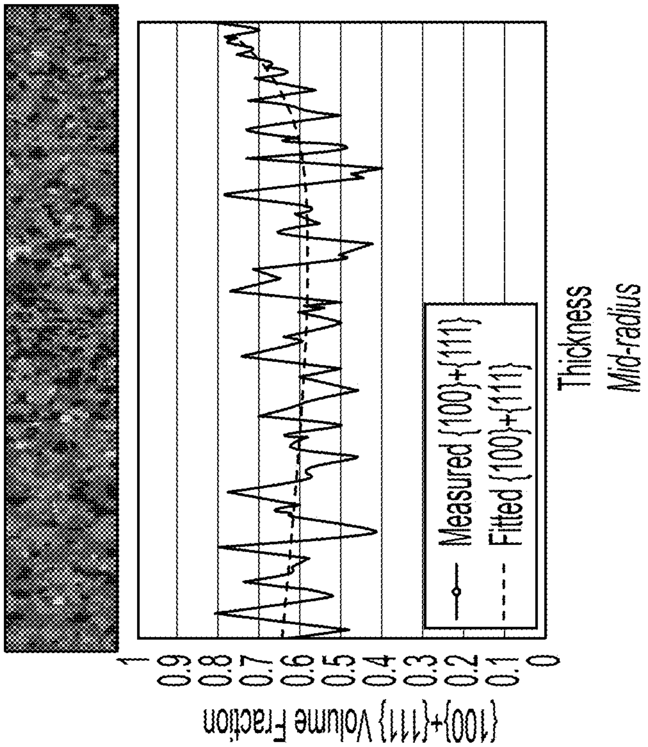
Figure 4C:
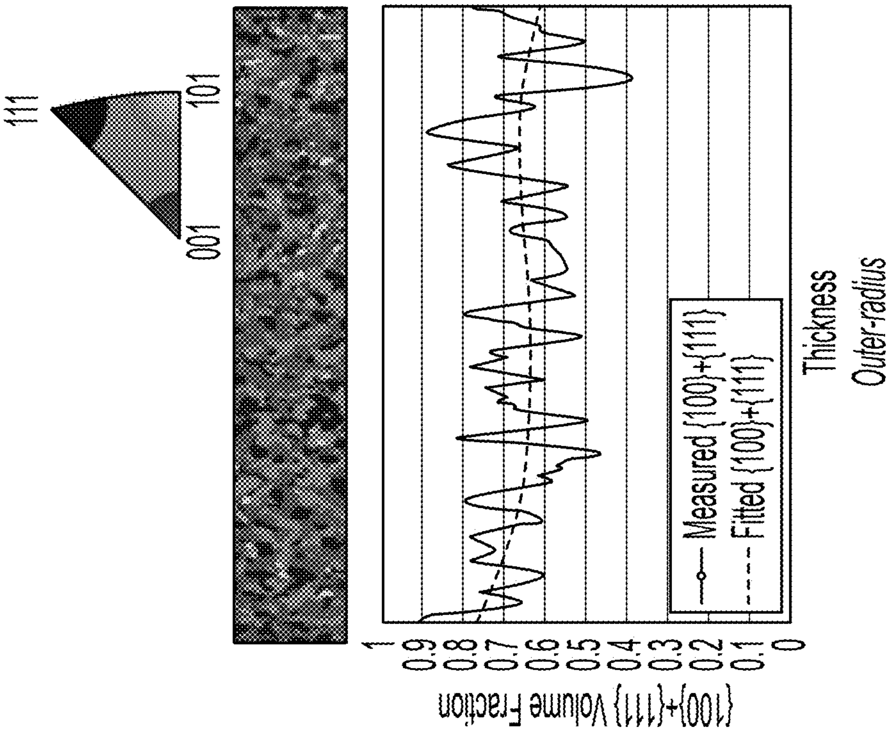

Metallography and electron backscatter diffraction (EBSD) analysis were performed on the tantalum samples collected from center, mid-radius and outer-radius locations of the tantalum blank. As depicted in FIGS. 4A-C, the through thickness texture is rather uniform at different locations. In addition, the {100}+{111} volume fraction is relatively stable through target blank thickness at all locations. FIG. 10 is a table comparing {100}+{111} volume fraction for tantalum sputtering targets manufactured using typical exemplary method shown in FIG. 1 and the new method shown in FIGS. 2-3. As can be seen upon review of the table of FIG. 10, the average {100}+{111} volume fraction is 0.63, 0.61, 0.66 at center, mid-radius and outer-radius, respectively. More importantly, through thickness non-uniformity of {100}+{111} volume fraction, defined as standard deviation/average, is only 14.9%, 14.6%, 15.2% at center, mid-radius and outer-radius, respectively. It is predicted that tantalum targets with these characteristics should lead to good film uniformity and stable deposition rate during sputtering.

It should be noted that for the tantalum targets produced via the process disclosed in the present invention, the texture and through thickness texture uniformity for the outer radius location is very similar to those of the center and mid radius locations. This implies that the sample from discarded edge locations of tantalum plate is representative of the bulk of the tantalum plate, making it possible to predict tantalum target sputtering performance from the texture data of the edge samples.

Example 2—Made in Accordance with Method 300

A tantalum slice was sawed from a tantalum billet, which was converted from an electron beam melted tantalum ingot via a series of forging and annealing steps, as outlined in 305. The tantalum billet slice was first upset forged to create 24% thickness reduction. The upset forged tantalum puck was then cold rolled using varying reduction per pass of 6-11% to obtain an 18.5-inch diameter×0.315-inch thick tantalum target blank. The tantalum target blank was then subjected to 1,000° C. final anneal and roll leveled.

Figure 5A:
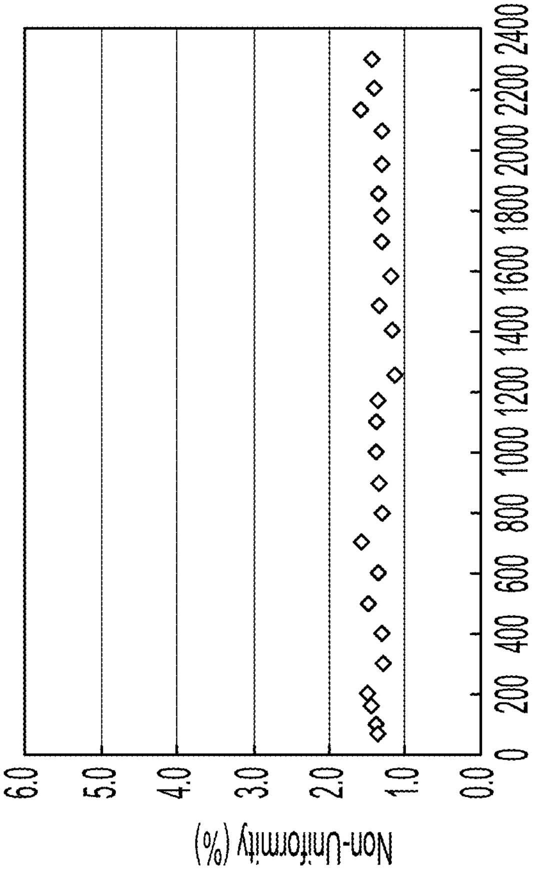
FIGS. 5A-B are graphs of tantalum film uniformity and deposition rates for a tantalum sputtering target produced using the method shown in FIGS. 2-3 in accordance with various disclosed aspects herein.
Figure 5B:
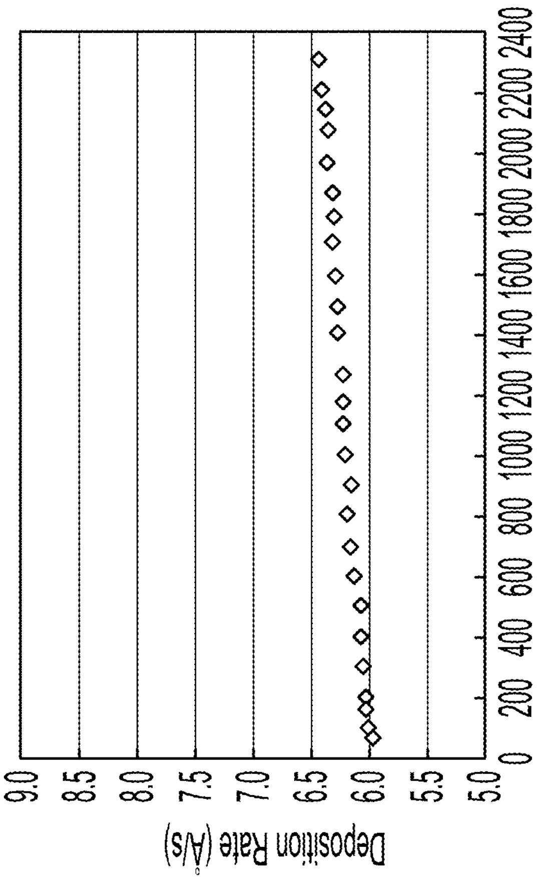

Subsequently, the tantalum target blank was machined and diffusion bonded to an Al alloy backing plate. After final machining, the tantalum target was sputtered on Applied Materials Endura 2 for 2,300 kWh. The resulting tantalum film Rs non-uniformity and deposition rate were measured, and the results are shown in FIGS. 5A-B. Rs non-uniformity was stable from the beginning to the end of target life. As listed in Table 2, average non-uniformity is 1.35%, non-uniformity range through target life is only 0.46%, and non-uniformity standard deviation through target life is only 0.11%. The deposition rate is also stable through target life. FIG. 12 is a table comparing deposition rate (Å/s) for tantalum targets manufactured using typical exemplary method shown in FIG. 1 and the new method shown in FIGS. 2-3. As can be seen upon review of the table in FIG. 12, the average deposition rate is 6.21 Å/s, range for deposition rate through target life is only 0.47 Å/s, and standard deviation is only 0.13 Å/s.

Example 3—Made in Accordance with Method 300

A tantalum slice was sawed from a tantalum billet, which was converted from an electron beam melted tantalum ingot via a series of forging and annealing steps, as outlined in 305. The tantalum billet slice was first upset forged to create 25% thickness reduction. The upset forged tantalum puck was then cold rolled using varying reduction per pass of 6-11% to obtain a 18.7-inch diameter×0.31-inch thick tantalum blank. The tantalum blank was then subjected to 1,000° C. final anneal and roll leveled.

Figure 6A:
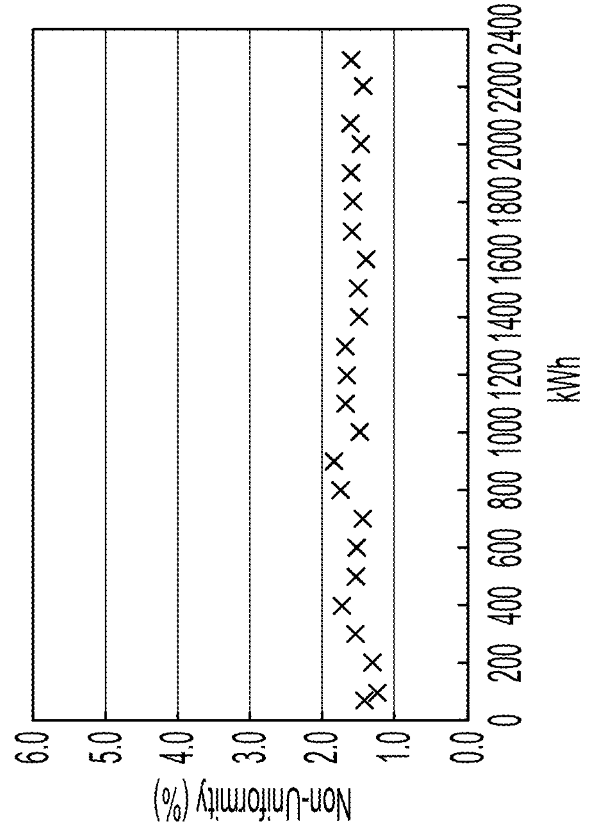
FIGS. 6A-B are graphs of tantalum film uniformity and deposition rates for a tantalum sputtering target produced using the method shown in FIGS. 2-3 in accordance with various disclosed aspects herein.
Figure 6B:
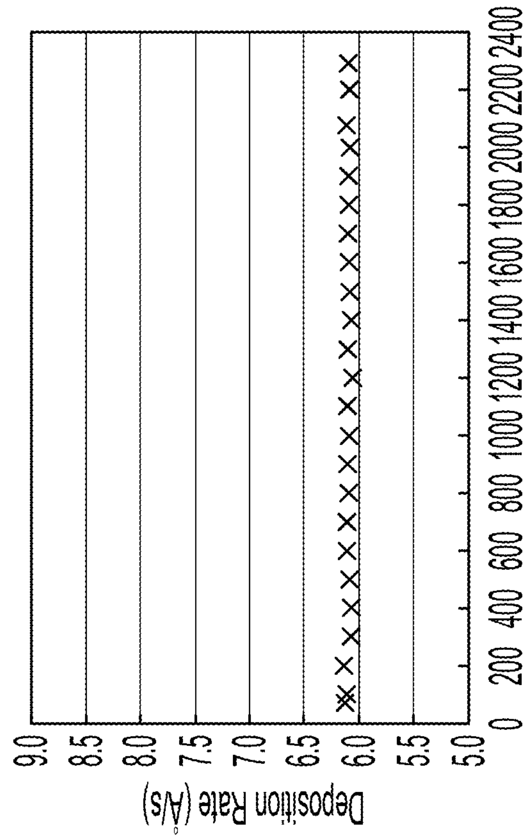

Subsequently, the tantalum blank was machined and diffusion bonded to an Al alloy backing plate. After final machining, the tantalum target was sputtered on Applied Materials Endura 2 for 2,300 kWh. Tantalum film Rs non-uniformity and deposition rate were measured, and the results are shown in FIGS. 6A-B. Rs non-uniformity was stable from the beginning to the end of target life. As listed in Table 2, average non-uniformity is 1.55%, non-uniformity range through target life is only 0.61%, and non-uniformity standard deviation through target life is only 0.14%. The deposition rate is also stable through target life. Further, upon review of the table in FIG. 12, the average deposition rate is 6.1 Å/s, range for deposition rate through target life is only 0.07 Å/s, and standard deviation is only 0.02 Å/s.

Comparative Example 1—Made in Accordance with the Existing Methods Shown in FIG. 1

Figure 7A:
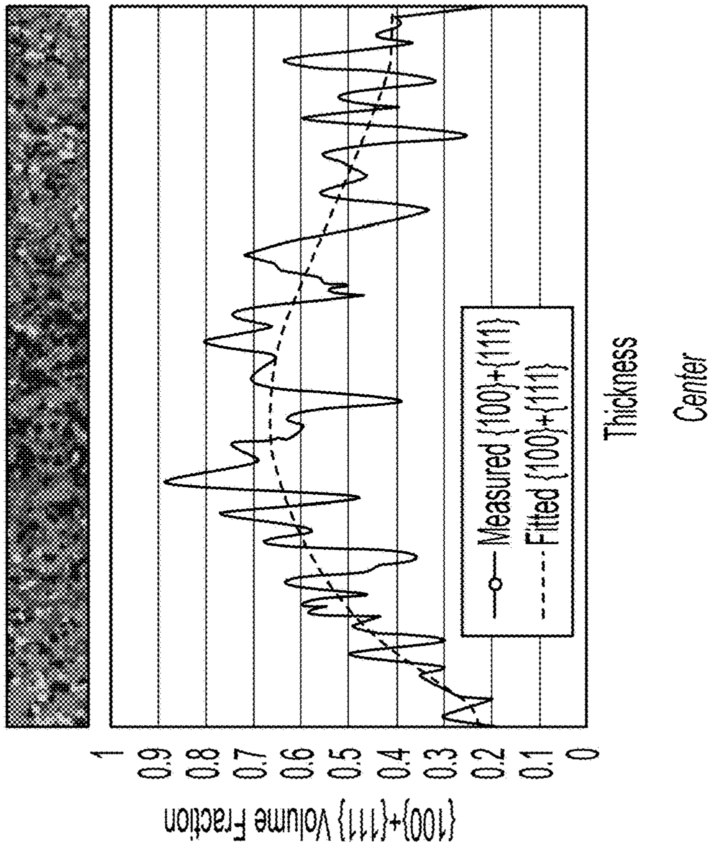
FIGS. 7A-C are through thickness EBSD orientation maps and {100}+{111} volume fraction plots at different locations of a tantalum target blank produced using the typical exemplary method shown in FIG. 1.
Figure 7B:
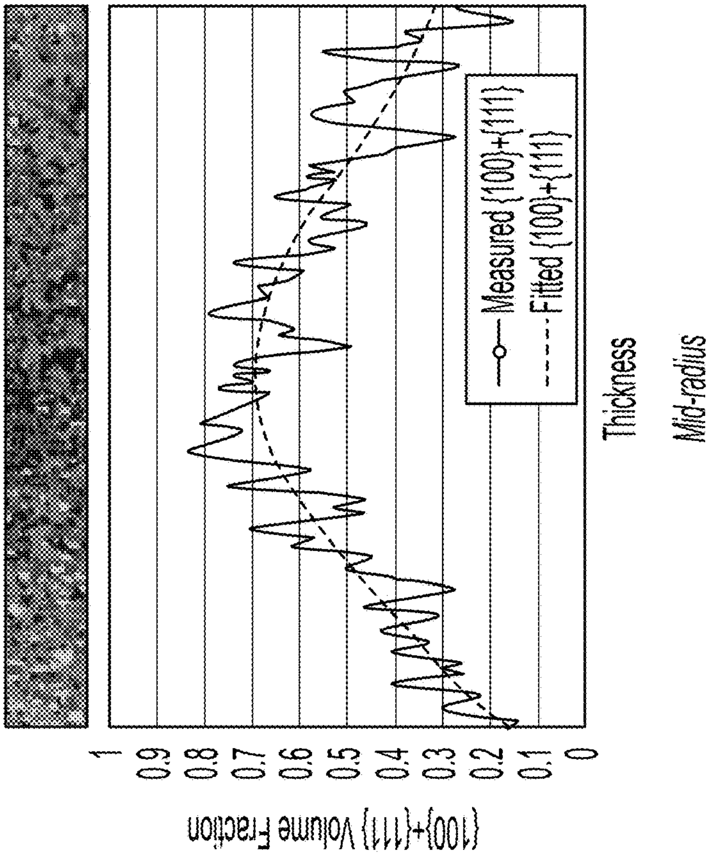
Figure 7C:
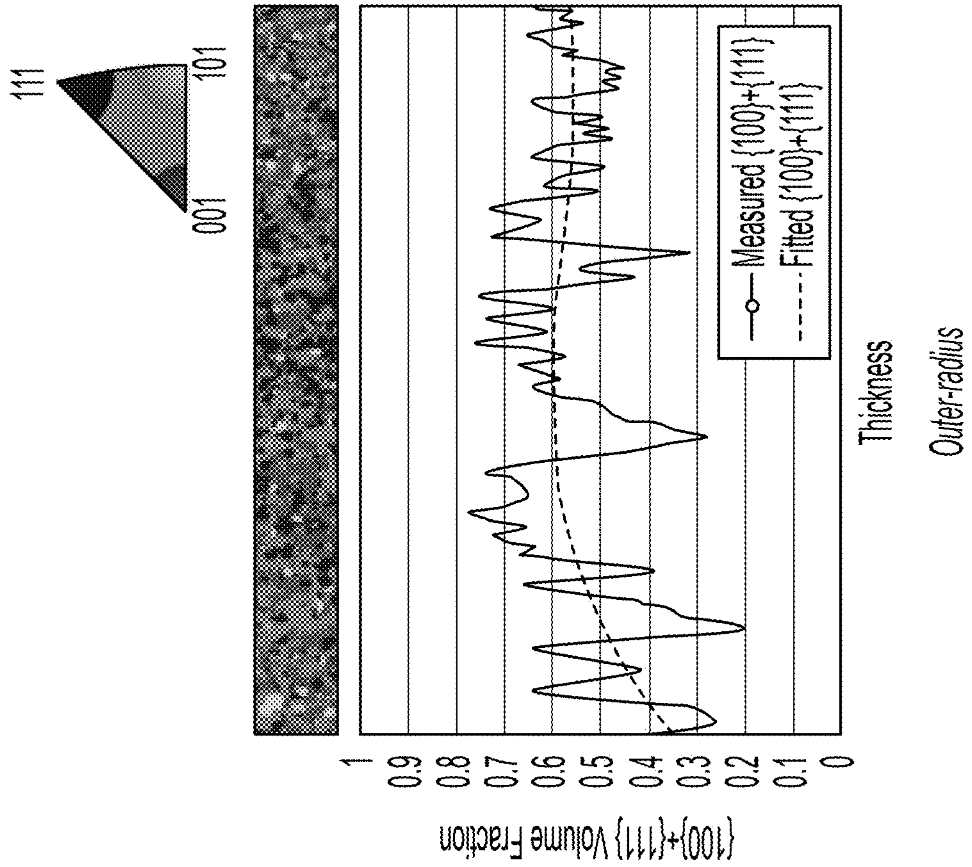

A tantalum slice was sawed from a tantalum billet, which was converted from an electron beam melted tantalum ingot via a series of forging and annealing, as outlined in 305. The tantalum billet slice was first upset forged to create 58% thickness reduction. The pressed tantalum puck was then cold rolled using constant reduction per pass of ~12% to obtain a 18.5-inch diameter×0.32-in thick tantalum blank. The tantalum blank was then subjected to 1,000° C. final anneal and roll leveled. Metallography and electron backscatter diffraction (EBSD) analysis were performed on the tantalum samples collected from center, mid-radius and outer-radius locations of the tantalum blank. As depicted in FIGS. 7A-C, the through thickness texture is not uniform at different locations—{111} banding is present around half-thickness of the blank. In addition, the {100}+{111} volume fraction changes drastically through target blank thickness, in particular at center and mid-radius locations, where most of sputtering occur. As can be seen upon review of the table in FIG. 10, the average {100}+{111} volume fraction is 0.52, 0.11, 0.55 at center, mid-radius and outer-radius, respectively. While the average {100}+{111} volume fraction does not change much at different locations, through thickness non-uniformity of {100}+{111} volume fraction, is 28.0%, 32.3%, 22.5% at center, mid-radius and outer-radius, respectively, much higher than the corresponding values for Example 1 tantalum blank produced using a process of the present invention. Based on the texture data, it is predicted that a tantalum target similar to that of Comparative Example 1 will lead to poor film uniformity and unstable deposition rate during sputtering. It is further predicted that the deposition rate during early target life will be high but it will decrease until at least half of the target thickness.

It should be noted that for tantalum targets produced via the prior process as illustrated in this comparative example, the texture and through thickness texture uniformity for the outer radius location is drastically different from those of the center and mid radius locations. This shows that the sample from discarded edge locations of tantalum plate is not representative of the bulk of the tantalum plate, making it impossible to predict tantalum target sputtering performance from the texture data of the edge samples only.

Comparative Example 2—Made in Accordance with the Existing Methods Shown in FIG. 1

A tantalum slice was sawed from a tantalum billet, which was converted from an electron beam melted tantalum ingot via a series of forging and annealing, as outlined in 305. The tantalum billet slice was first upset forged to create 58% thickness reduction. The pressed tantalum puck was then cold rolled using constant reduction per pass of ~12% to obtain a 18.5-inch diameter×0.32-in thick tantalum blank. The tantalum blank was then subjected to 1,000° C. final anneal and roll leveled.

Figure 9B:
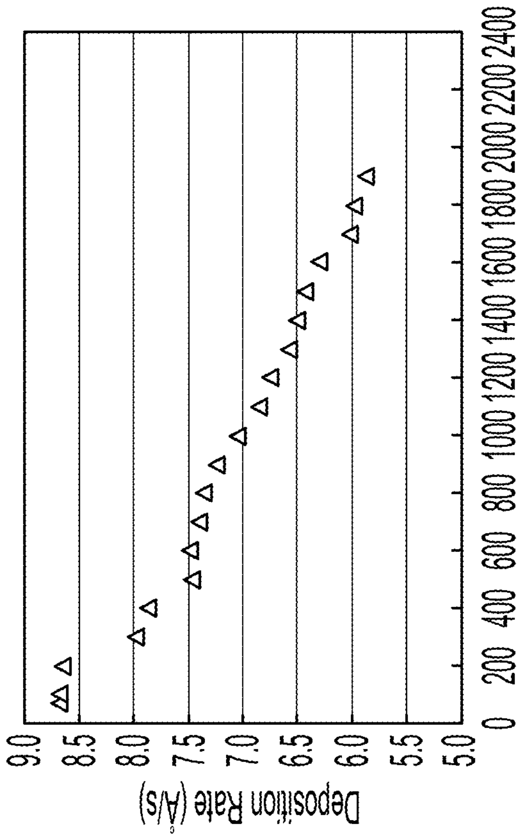
FIGS. 9A-B are graphs of tantalum film uniformity and deposition for a tantalum target produced using the typical exemplary method shown in FIG. 1.
Figure 9A:
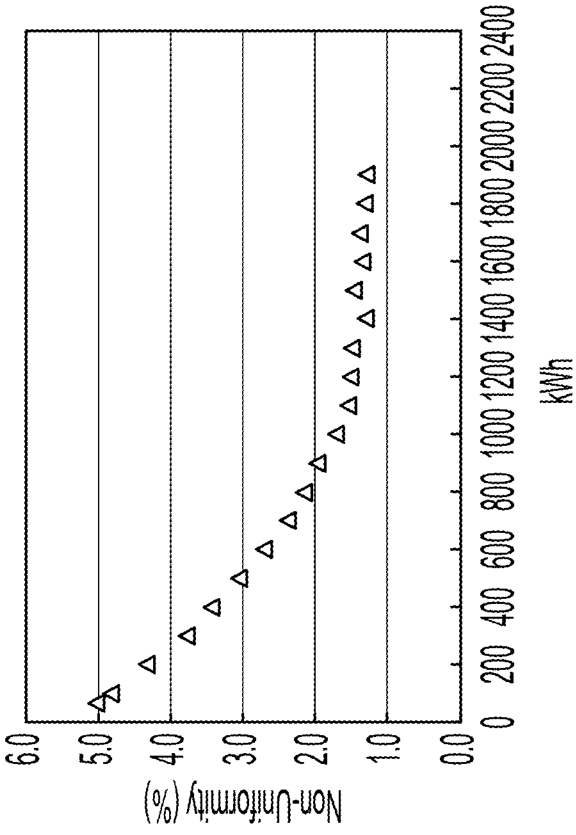

Subsequently, the tantalum blank was machined and diffusion bonded to an Al alloy backing plate. After final machining, the tantalum target was sputtered on Applied Materials Endura 2 for 2,300 kWh. Tantalum film Rs non-uniformity and deposition rate were measured, and the results are shown in FIGS. 9A-B. Rs non-uniformity was above 4% at the beginning of target life, and continuously decreased until 1,200 kWh. FIG. 11 is a table comparing film Rs non-uniformity (NU %) for tantalum sputtering targets manufactured using the typical exemplary method shown in FIG. 1 and the new method shown in FIGS. 2-3. As can be seen upon review of the table in FIG. 11, the average non-uniformity is 2.05%, non-uniformity range through target life is 2.91%, and non-uniformity standard deviation through target life is 0.99%. The deposition rate is not stable either. Further, as can be seen upon review of the table in FIG. 12 and FIGS. 9A-B, the average deposition rate is 6.48 Å/s, range for deposition rate through target life is 1.45 Å/s, and standard deviation is 0.55 Å/s.

Comparative Example 3—Made in Accordance with the Existing Methods Shown in FIG. 1

A tantalum slice was sawed from a tantalum billet, which was converted from an electron beam melted tantalum ingot via a series of forging and annealing, as outlined in 305. The tantalum billet slice was first upset forged to create 58% thickness reduction. The pressed tantalum puck was then cold rolled using constant reduction per pass of ~12% to obtain a 18.5-inch diameter×0.32-in thick tantalum blank. The tantalum blank was then subjected to 1, 100° C. final anneal and roll leveled.

Figure 8A:
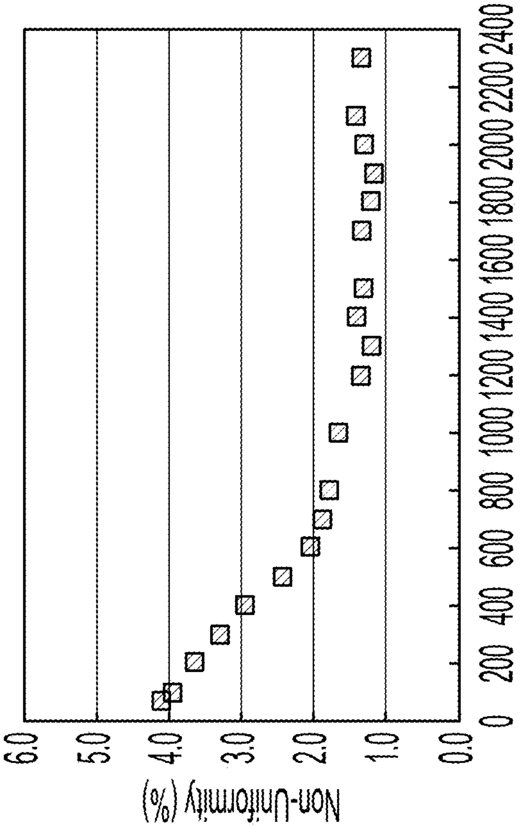
FIGS. 8A-B are graphs of tantalum film uniformity and deposition for a tantalum target produced using the typical exemplary method shown in FIG. 1.
Figure 8B:
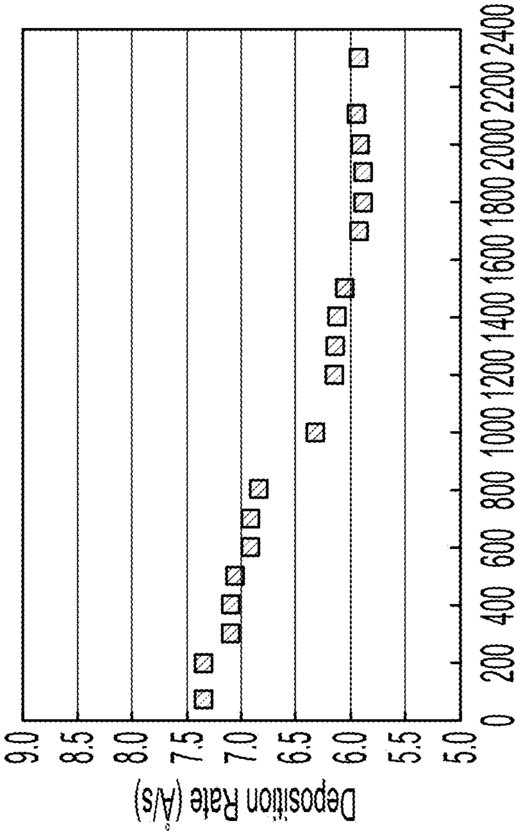

Subsequently, the tantalum blank was machined and diffusion bonded to an Al alloy backing plate. After final machining, the tantalum target was sputtered on Applied Materials Endura 2 for 1,900 kWh. Tantalum film Rs non-uniformity and deposition rate were measured, and the results are shown in FIGS. 8A-B. Rs non-uniformity was around 5% at the beginning of target life, and continuously decreased until 1,100 kWh. As can be seen upon review of the table in FIG. 11, the average non-uniformity is 2.41%, non-uniformity range through target life is 3.75%, and non-uniformity standard deviation through target life is 1.25%. The deposition rate is not stable either. As can be seen upon review of the table in FIG. 12, the average deposition rate is 7.16 Å/s, range for deposition rate through target life is 2.81 Å/s, and standard deviation is only 0.89 Å/s.

What has been described above includes examples of the present specification. It is, of course, not possible to describe every conceivable combination of components or methodologies for purposes of describing the present specification, but one of ordinary skill in the art may recognize that many further combinations and permutations of the present specification are possible. Each of the components or methodologies described above may be combined or added together in any permutation. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

The invention claimed is:

1. A method of making a tantalum sputtering target comprising the steps of:

providing a tantalum ingot, said ingot having a generally cylindrical configuration with a central longitudinal axis;

sectioning said tantalum ingot by cutting said tantalum ingot transverse to said central longitudinal axis to form at least a billet slice; wherein said billet slice is generally cylindrical and shorter than said tantalum ingot, when measured along said central longitudinal axis of said tantalum ingot and a central longitudinal axis of said billet slice;

thermo-mechanically processing said billet slice to form a tantalum target blank, wherein said thermo-mechanically processing is comprised of upset forging reduction and varying rolling reduction; said upset forging reduction results in a thickness reduction between about 15%-35% of said billet slice and said varying rolling reduction results in a thickness reduction of said billet slice varying between about 5%-15% per pass;

wherein localized shear forces are not imparted into said billet slice by said varying rolling reduction.

2. The method of claim 1, wherein said tantalum target has a total volume fraction of crystallographic texture planes, wherein said tantalum target has an average of {100}+{111} volume fraction of said crystallographic texture planes equal to about 55-75% of said total volume fraction of crystallographic texture planes.

3. The method of claim 1, wherein said tantalum target has a through thickness crystallographic texture variation of a {100}+{111} volume fraction of less than about 20% of a total volume fraction of crystallographic planes within said tantalum target.

4. The method of claim 1, wherein said tantalum target, when sputtered, produces a deposited film having a non-uniformity better than 2% through a life of said tantalum target, wherein said life of said tantalum target is from a burn-in of said tantalum target to an end-of-life of said tantalum target.

5. The method of claim 1, wherein a deposition rate throughout a life of said tantalum target, when sputtered, has less than 5% deviation from an average deposition rate throughout said life of said tantalum target.

6. The method of claim 1, wherein said tantalum ingot has a purity of 99.99% or greater.

7. The method of claim 1, wherein said varying rolling reduction is clock rolling.

8. The method of claim 1, wherein a per pass reduction of said varying rolling reduction increases about 10-20% per pass.

9. The method of claim 1, further comprising the steps of:
annealing and leveling said tantalum target blank; and
machining said target blank and bonding said target blank to a backing plate after said machining.

10. The method of claim 1, wherein said thermo-mechanically processing said billet slice to form said tantalum target blank includes only a single rolling process, wherein said single rolling process is said varying rolling reduction.

11. The method of claim 1, wherein said thermo-mechanically processing said billet slice to form said tantalum target blank includes only a single rolling process, wherein said single rolling process is varying clocked rolling reduction.

* * * * *